United States Patent [19]
Drowley et al.

[11] Patent Number: 6,023,081
[45] Date of Patent: Feb. 8, 2000

[54] SEMICONDUCTOR IMAGE SENSOR

[75] Inventors: Clifford I. Drowley, Phoenix; Mark S. Swenson, Higley; Jennifer J. Patterson, Mesa; Shrinath Ramaswami, Gilbert, all of Ariz.

[73] Assignee: Motorola, Inc., Schaumburg, Ill.

[21] Appl. No.: 08/970,720

[22] Filed: Nov. 14, 1997

[51] Int. Cl.$^7$ .................. H01L 31/062; H01L 31/113
[52] U.S. Cl. .................. 257/292; 257/290; 257/293
[58] Field of Search .................. 257/290–293, 257/53, 232–233, 369, 225–230

[56] References Cited

U.S. PATENT DOCUMENTS

| | | | |
|---|---|---|---|
| 3,887,993 | 6/1975 | Okada et al. ........................... | 257/384 |
| 4,484,210 | 11/1984 | Shiraki et al. . | |
| 4,735,680 | 4/1988 | Yen ........................................ | 257/384 |
| 4,868,623 | 9/1989 | Nishiura ................................. | 257/53 |
| 5,216,491 | 6/1993 | Yamamoto et al. .................... | 257/292 |
| 5,625,210 | 4/1997 | Lee et al. . | |

OTHER PUBLICATIONS

S.M. SZC Physics of Semiconductor Devices ISBN 0–471–05661–8 TK781.85.5988 1981 A Wiley–Interscience Publication pp. 754,759,760 .

Microelectronic Devices Edward S. Young p. 63 McGraw–Hill Book Co. 1988.

Physis of Semiconductor Devices Second Edition S.M. SZC p. 66 John Wiley & Son, Inc. 1981.

Device Electronics for Integrated Circuit Second Edition Richard S. Muller p. 94 John Wiley & Son, Inc. 1986.

B. C. Burkey et al., "The Pinned Photodiode for an Inter-line–Transfer CCD Image Sensor", IEDM–84, 1984, Section 2.3, pp. 28–31.

*Primary Examiner*—Minh Loan Tran
*Assistant Examiner*—Cuong Quang Nguyen
*Attorney, Agent, or Firm*—Robert F. Hightower; A. Kate Huffman

[57] ABSTRACT

An image sensor (10) has an image sensing element that includes an N-type conducting region (26) and a P-type pinned layer (37). The two regions form two P-N junctions at different depths that increase the efficiency of charge carrier collection at different frequencies of light. The conducting region (26) is formed by an angle implant that ensures that a portion of the conducting region (26) can function as a source of an MOS transistor (32).

4 Claims, 3 Drawing Sheets

SEMICONDUCTOR IMAGE SENSOR

BACKGROUND OF THE INVENTION

This application is related to an application entitled CMOS IMAGE SENSOR by Michael Guidash filed on the same day as the instant application, and an application entitled METHOD OF FORMING A SEMICONDUCTOR IMAGE SENSOR AND STRUCTURE by Drowley et al and filed concurrently herewith.

This invention relates, in general, to semiconductor devices, and more particularly to a semiconductor image sensor.

In the past, a variety of methods were used to form semiconductor image sensors on a substrate with complementary metal oxide semiconductor (CMOS) devices. Typically, the optical receiving portion of the sensor is formed either as a gate of a large area transistor, often referred to as a photo-gate, or as a source-drain junction of a metal oxide semiconductor (MOS) transistor. The photo-gate transistor implementation requires that light travel through the silicon gate of the transistor in order to convert light to electrical energy. Consequently, the photo-gate implementation has reduced sensitivity. Additionally, the depletion region generally is shallow (less than one micron) thereby reducing the collection efficiency of carriers induced by red light absorption. Also conventional photo-gate implementations are susceptible to noise created by surface recombination.

The source-drain junction implementation generally has a junction that is optimized for transistor operation and therefor also has a shallow junction that results in inefficient collection of carriers induced by red light. Another disadvantage of the source-drain junction implementation is that the junction typically is formed in a highly doped (greater than $10^{16}$ atoms/cm$^3$) region that limits the width of the junction depletion region thereby further reducing the collection efficiency of carriers induced by red light absorption. Furthermore, forming the junction in such a highly doped region results in a large capacitance that reduces the amount of charge that can be transferred from the photo sensing element to other electronics.

Traditional CMOS image sensor implementations often form a silicide layer over the image sensing element thereby further reducing sensitivity.

Accordingly, it is desirable to have an image sensor that does not utilize a photo-gate thereby resulting in higher efficiency, that does not have a shallow junction depth thereby increasing efficiency, that minimizes noise from surface recombination, that does not use a silicide overlying the light sensing area thereby further increasing efficiency, that has a wide depletion region for further increasing of carrier conversion for all wavelengths of light, and that does not have a large capacitance that minimizes the charge transferred from the image sensing element to other electronics.

DETAILED DESCRIPTION OF THE DRAWINGS

Figure 1:
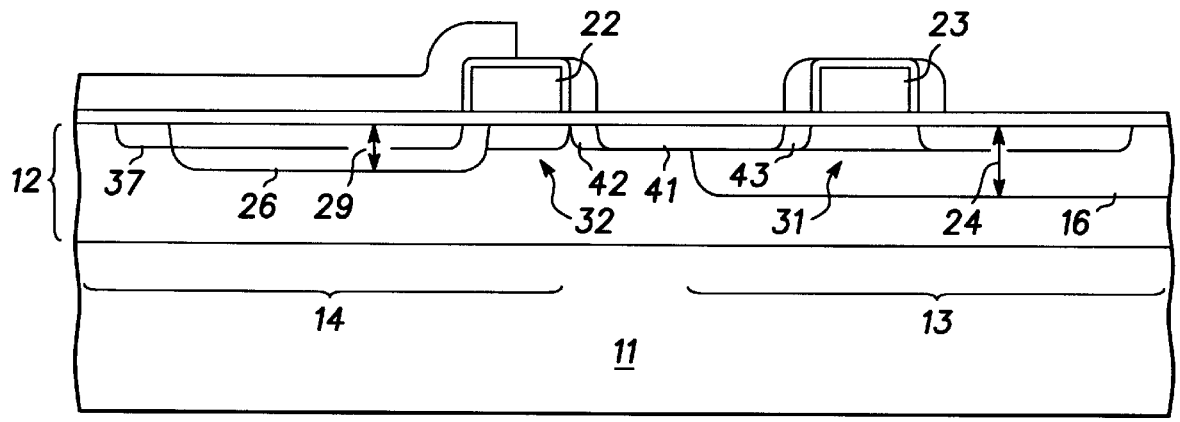
FIG. 1 illustrates an enlarged cross-sectional portion of an image sensor embodiment in accordance with the present invention.

FIG. 1 illustrates an enlarged cross-sectional portion of a semiconductor image sensor 10. Sensor 10 includes an underlying P-type substrate formed by a semiconductor substrate 11 and an enhancement layer 12 formed thereon. Sensor 10 has a first well or P-type well 16 formed in a first portion 13 of the underlying substrate. Well 16 typically has a doping concentration that is higher than the doping concentration in a second portion 14 of the underlying substrate's layer 12. Portions 13 and 14 of layer 12 are identified by a brackets shown below layer 12. This second portion of layer 12 forms a second well within the underlying substrate. The surface doping concentration of well 16 typically is at least $1 \times 10^{16}$ atoms/cm$^3$. A first depth or depth 24 of well 16 typically is less than the depth of layer 12 and typically is about two to four microns in order to facilitate forming other CMOS devices on substrate 11.

The image capturing or light sensing element of sensor 10 includes an N-type conducting region 26 that is formed in the second well or second portion 14. Conducting region 26 forms a first P-N junction with the P-type material of the underlying substrate. This first P-N junction is positioned at a second depth or depth 29 of conducting region 26 in order to readily sense light in the red wavelengths and typically is less than approximately 0.7 microns, and preferably about 0.5 microns, from the surface of the underlying substrate. A P-type pinning layer 37 is formed within region 26 and extends outward from region 26 into layer 12 of the underlying substrate in order to form an electrical connection with the underlying substrate. This electrical connection pins the potential applied to this element of the image sensor. Consequently, the resulting photodiode is often referred to as a pinned photodiode. A second P-N junction is formed along the intersection of layer 37 and region 26. Typically layer 37 is formed simultaneously with the formation of lightly doped drain and source regions of other P-channel MOS transistors (not shown) on substrate 11. The depth of the second P-N junction is less than that of the first P-N junction. This depth is selected to optimize the absorption or sensing of light in the blue wavelengths. A transfer transistor or first MOS transistor 32 is formed adjacent to conducting region 26 so that a portion of region 26 forms a source of transistor 32. A second or reset MOS transistor 31 is formed within well 16. Transistor 31 has a source that is electrically coupled to transistor 32 by a coupling region 41.

Conducting region 26 is formed by applying a mask having an opening that exposes some of the surface of portion 14 extending up to and including a portion of a gate 22 of transistor 32. Then dopants are implanted at an angle away from perpendicular to substrate 11 and toward gate 22 to ensure that region 26 extends under gate 22, thereby saving masking and other processing operations in forming region 26 and the source of transistor 32.

Figure 2:
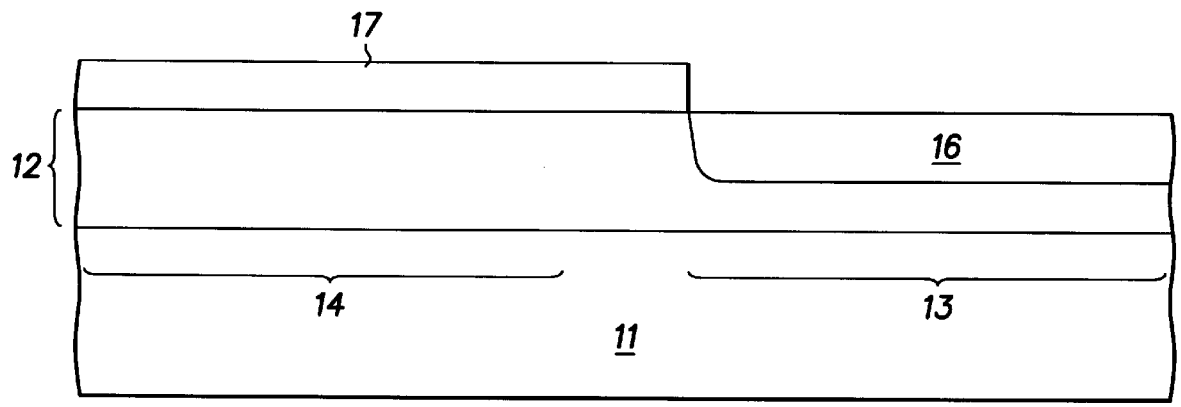
FIG. 2 illustrates an enlarged cross-sectional portion of the FIG. 1 embodiment at a manufacturing stage in accordance with the present invention.

FIG. 2 illustrates an enlarged cross-sectional portion of a stage in an embodiment of manufacturing sensor 10 shown in FIG. 1. Sensor 10 includes a heavily doped P-type substrate 11 having a lightly doped P-type enhancement layer 12 formed thereon. Typically, substrate 11 has a first or P-type doping concentration of at least $1 \times 10^{16}$, and preferably $1 \times 10^{18}$, atoms/cm$^3$ and layer 12 has a P-type doping concentration no greater than approximately $1 \times 10^{15}$ atoms/cm$^3$. Additionally, layer 12 includes first portion 13 in which first well or P-well 16 is formed, and second well or second portion 14 in which the light sensing element of sensor 10 will be formed. Forming the light sensing elements in lightly doped second portion 14 that overlies more heavily doped substrate 11 enhances carrier collection in the light sensing element.

P-type well 16 is formed by applying a mask 17 to expose the surface of first portion 13 of layer 12. Dopants are formed within the exposed surface to form well 16. After forming well 16, mask 17 is removed.

Figure 3:
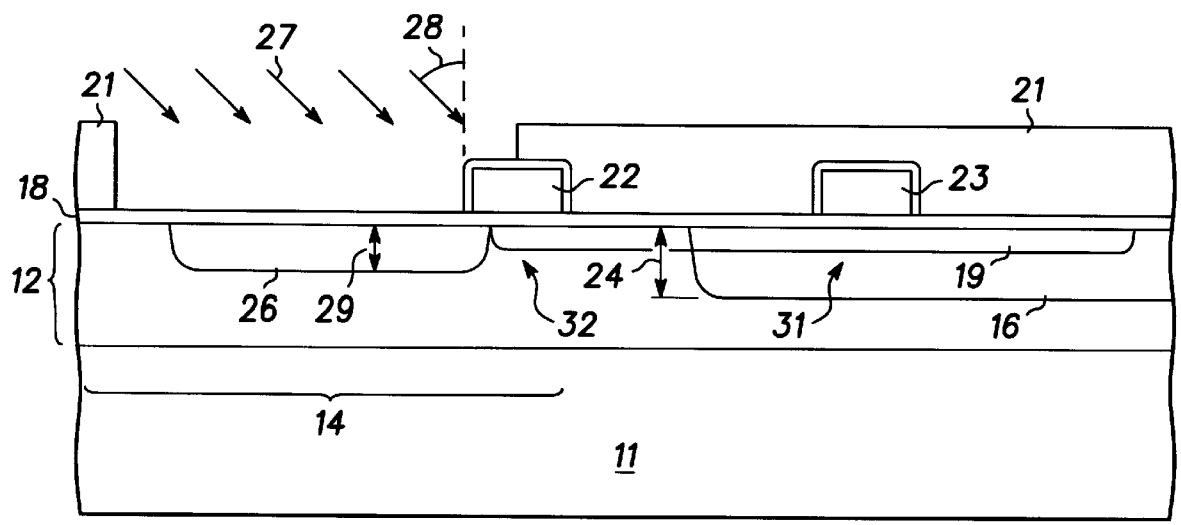
FIGS. 3–7 illustrate enlarged cross-sectional portions of the FIG. 1 embodiment at a subsequent manufacturing stages in accordance with the present invention.

FIG. 3 illustrates an enlarged cross-sectional portion of sensor 10 shown in FIGS. 1 and 2 at a subsequent formation stage. Like elements in FIGS. 1, 2, and 3 have the same element numbers. A gate oxide 18 is formed across the surface of sensor 10. Thereafter, a channel doping region 19 is formed to facilitate creating channels for MOS transistors 31 and 32. Gates 23 and 22 are formed on oxide 18 to facilitate the formation of transistors 31 and 32, respectively.

Thereafter, a mask 21 is applied to expose the area of second portion 14 in which conducting region 26 is to be formed. Mask 21 has an opening that exposes a portion of the surface of gate oxide 18 in second portion 14 the exposed portion extends from an edge of gate 22 into second portion 14, and also exposes a portion of gate 22. Dopants, illustrated by arrows 27, are implanted at an angle 28 toward gate 22. Angle 28 is measured away from a line normal to the surface of sensor 10. Angle 28 typically is greater than fifteen degrees, and preferably is at least twenty five degrees, from normal to the surface of sensor 10. This angle implant is used to ensure that region 26 extends slightly under gate 22 to facilitate utilizing a portion of region 26 to function as the source of transistor 32, thereby connecting the channel of transistor 32 to conducting region 26. Subsequent to forming region 26, mask 21 is removed.

Alternately, two different implants can be utilized to form region 26. A high energy implant, for example 120–190 keV, can be used near normal to the surface of sensor 10 in order to form region 26 deep within layer 12. Thereafter a lower energy implant, for example 90–130 keV, can be formed at an angle substantially equal to angle 28 and at a low energy to ensure that a portion of region 26 extends under gate 22.

Figure 4:
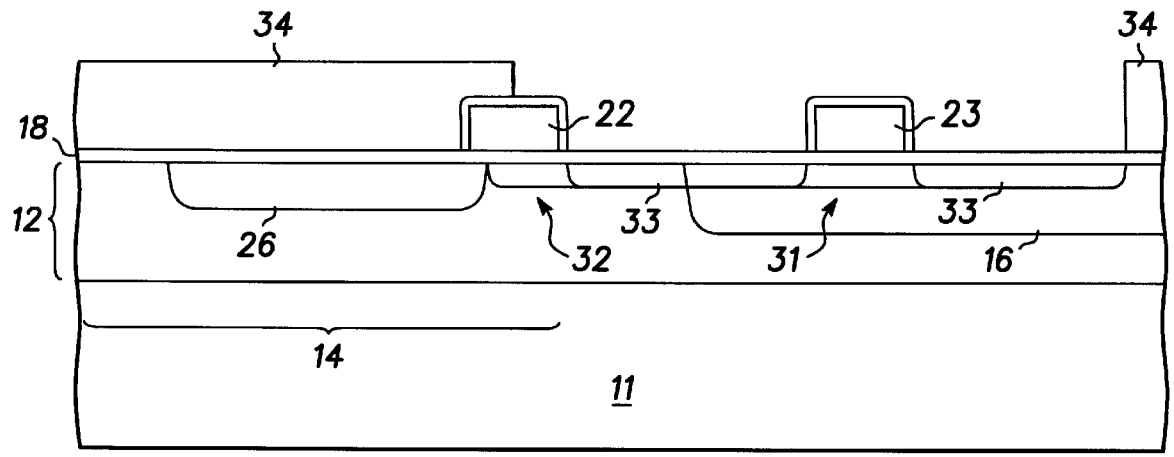

FIG. 4 represents a subsequent stage in the formation of sensor 10. Similar elements in FIGS. 1, 2, 3, and 4 are represented by the same element numbers. A mask 34 is applied with an opening that exposes the areas for forming the drain of transistor 32, and the source and drain of transistor 31. Thereafter, source-drain dopants 33 are formed in layer 12 using the edges of gates 22 and 23 as masks to self-align the source and drain areas to gates 22 and 23. Thereafter, mask 34 is removed.

Figure 5:
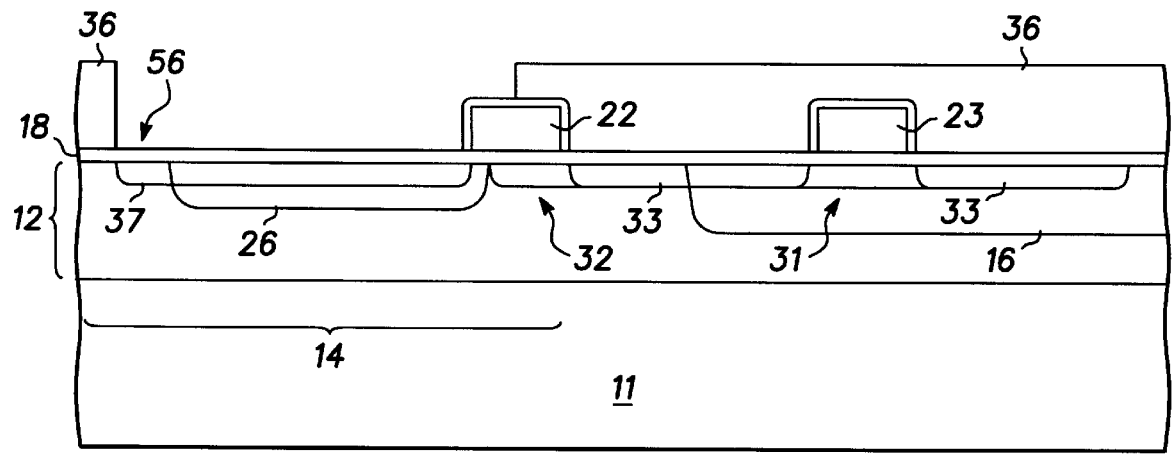

FIG. 5 illustrates an enlarged cross-sectional portion of a subsequent stage in forming sensor 10. Similar elements in FIGS. 1, 2, 3, 4, and 5 are represented by the same element numbers. A mask 36 is applied having an opening that exposes an edge of gate 22, the surface of conducting region 26, and an area 56, shown by an arrow, extending past region 26. P-type dopants are formed in the exposed surface to form P-type pinning layer 37 within the exposed portion of region 26 and extending outward from region 26 into area 56 and away from transistor 32. The depth and doping concentration of layer 37 are chosen to facilitate transferring all photo induced charge from region 26 to the drain of transistor 32. Typically, layer 37 has a depth of approximately 0.2 to 0.3 microns and a surface doping concentration greater than approximately $5 \times 10^{17}$ atoms/cm$^3$. Subsequent to forming layer 37, mask 36 is removed.

Figure 6:
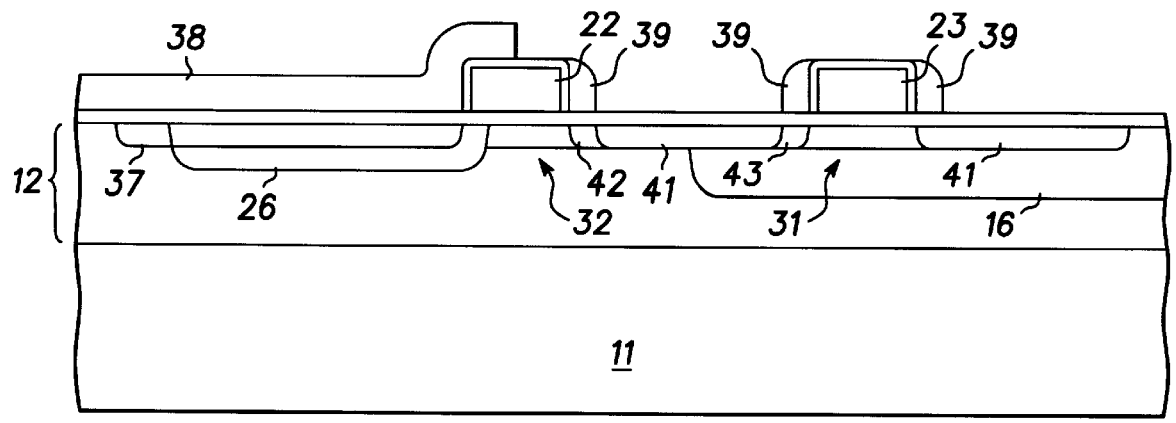

FIG. 6 illustrates a subsequent stage in the formation of sensor 10. Similar elements in FIGS. 1, 2, 3, 4, 5, and 6 are represented by the same element numbers. A dielectric material is applied to the surface of sensor 10 and is patterned to form spacers 39 on the sidewalls of gates 22 and 23, and to form a dielectric covering 38 overlying the light sensing element of sensor 10. Covering 38 typically extends onto gate 22 to form a mask for subsequent operations. The material used to form spacers 39 and covering 38 is chosen to have a dielectric constant between the dielectric constant of the underlying substrate and any material overlying covering 38. The dielectric constant of covering 38 chosen in order to minimize reflections between the underlying semiconductor material and any other dielectric or material placed on top of covering 38. For example, the material of covering 38 can be silicon nitride having a thickness of thirty to seventy nanometers in order to minimize reflections for light between the blue and red spectrums. Additionally, thickness of one hundred thirty to two hundred nanometers will also perform properly. Other materials such as aluminum oxide and aluminum nitride are also believed to be suitable materials for forming covering 38 and spacers 39.

Subsequently, spacers 39 and covering 38 are used as masks to form N-type dopants in layer 12 that result in forming coupling region 41 electrically connecting drain 42 and source 43.

Figure 7:
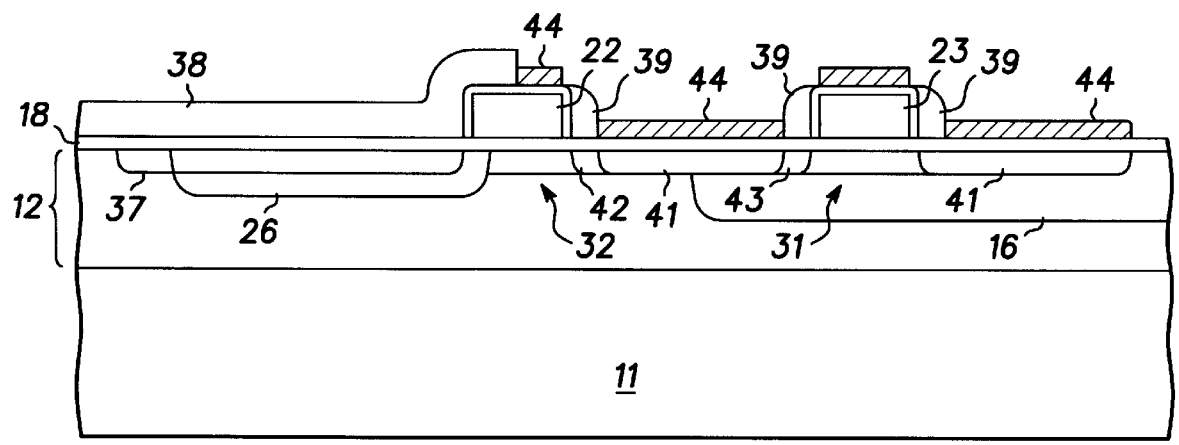

FIG. 7 illustrates a subsequent stage in the formation of sensor 10. Similar elements in FIGS. 1–7 are represented by the same element numbers. A low resistance material is applied to minimize the resistance of contacts made to both coupling region 41 and gates 22 and 23. Typically, titanium is blanket deposited across sensor 10 and then annealed to form titanium silicide with any exposed underlying silicon material. Consequently, layer 38 prevents forming a silicide overlying the photo-diode formed by region 26 and layer 37. The remaining titanium that does not form titanium silicide is removed thereby leaving low resistance contact materials 44 on gates 22, 23, and coupling region 41. Such formation techniques are well known to those skilled in the art. Generally, an interlayer dielectric, not shown, is formed over sensor 10 and contacts made to appropriate portions thereof.

Figure 8:
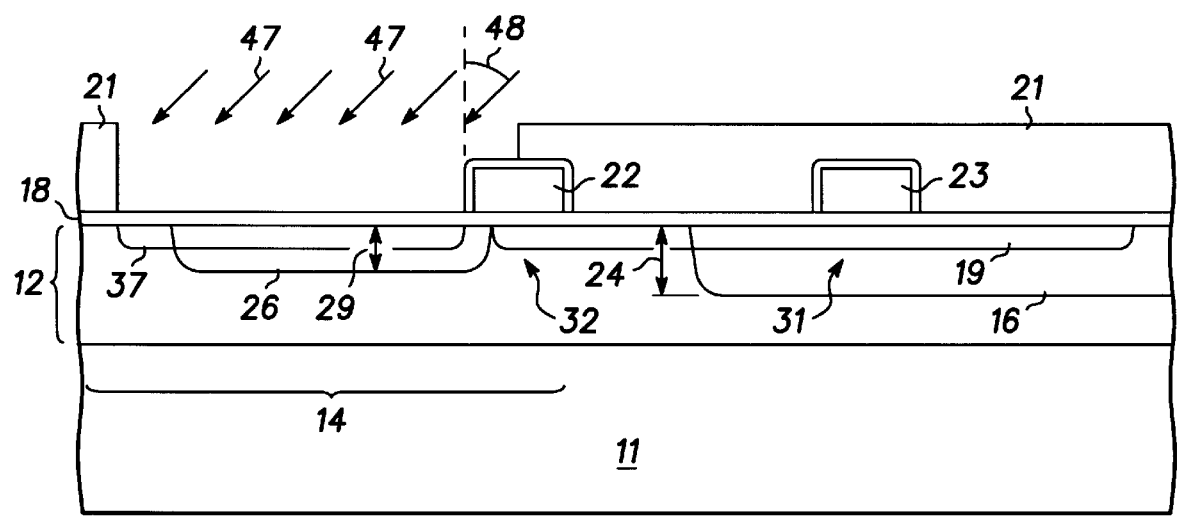
FIG. 8 illustrates an enlarged cross-sectional portion of an alternate embodiment of an image sensor in accordance with the present invention.

FIG. 8 illustrates an alternate embodiment for forming pinned layer 37 of sensor 10. Subsequent to forming conducting region 26 as discussed in FIG. 3, layer 37 can be formed by performing an implant at an angle opposite to angle 28 shown in FIG. 3. In this embodiment, dopants, represented by arrows 47, are implanted away from gate 22 at an angle 48 from normal to the surface of sensor 10. Typically, angle 48 is between ten and twenty five degrees to ensure that a portion of layer 37 extends outward from region 26 away from transistor 32. This portion of layer 37 is utilized to form contact with enhancement layer 12. For some processing sequences, this alternate embodiment can reduce the number of processing operations.

By now it should be appreciated that there has been provided a novel image sensor and method therefor. Forming the image sensor in a lightly doped region that overlies a more heavily doped region enhances carrier collection. Forming a deep conducting region and a shallower pinned layer forms two P-N junctions where one P-N junction, and the associated depletion region, is deep to facilitate capturing light in the red wavelengths and a second P-N junction, and the associated depletion region, is shallow facilitating capturing blue wavelength light. This structure also minimizes surface recombination and maximizes charge transfer. Using an angled implant to form the conducting region ensures the conducting region can be used as a source of a charge transfer transistor thereby minimizing manufacturing operations. Utilizing a dielectric material having a dielectric constant between the dielectric constant of the underlying substrate and overlying material minimizes reflections and enhances efficiency of the sensor. Ensuring that the light sensing element is devoid of an overlying silicide material also improves the efficiency of the sensor.

We claim:

1. An image sensor comprising:

a substrate of a first conductivity type having a first doping concentration;

an enhancement layer of the first conductivity type having a second doping concentration lower than the first doping concentration, the enhancement layer on the substrate;

a first MOS transistor on the enhancement layer;

a first well on the enhancement layer, the first well having the first conductivity type and a third doping concentration that is less than the first doping concentration and greater than the second doping concentration wherein the first MOS transistor is outside the first well; and a pinned photodiode on the enhancement layer wherein a portion of the pinned photodiode forms a source of the first MOS transistor.

2. The image sensor of claim 1 further including a second MOS transistor within the first well.

3. An image sensor comprising:

a substrate;

a pinned photodiode on the substrate;

a dielectric layer overlying the pinned photodiode; and a silicide layer on a portion of the image sensor wherein an area overlying the pinned photodiode is devoid of the silicide layer.

4. The sensor of claim 3 wherein the silicide layer on the portion of the image sensor includes the silicide layer on a gate of a MOS transistor.

* * * * *